United States Patent [19]

Leis et al.

[11] Patent Number: 4,954,788
[45] Date of Patent: Sep. 4, 1990

[54] PHASE LOCKED LOOP WITH BANDWIDTH RAMP

[75] Inventors: Michael Leis, Framingham; Gary S. Engelson, Shrewsbury; Bruce J. Lawrence, Worcester, all of Mass.

[73] Assignee: Digital Equipment Corporation, Maynard, Mass.

[21] Appl. No.: 453,356

[22] Filed: Dec. 18, 1989

Related U.S. Application Data

[63] Continuation of Ser. No. 193,337, May 12, 1988, abandoned.

[51] Int. Cl.$^5$ .............................................. H03L 7/00
[52] U.S. Cl. ............................................ 331/16; 331/25
[58] Field of Search ....................... 331/10, 15, 16, 18, 331/25, 34; 375/120; 455/260

[56] References Cited

U.S. PATENT DOCUMENTS 4,704,586 11/1987 Wahl et al. .............................. 331/25
4,712,076 12/1987 Cronch et al. ....................... 331/25 X

OTHER PUBLICATIONS

Digital Equipment Corp. RL01/RL02 Disk Controller, circa 1979.

Primary Examiner—Robert J. Pascal
Attorney, Agent, or Firm—Nutter, McClennen & Fish

[57] ABSTRACT

A phase locked loop that operates on an input signal received from a disk drive and similar data processing system peripherals, where the input signal has a preamble portion and a data portion. The phase locked loop providing a digital clock signal which is phase locked to the preamble portion. This is accomplished by adjusting the loop response time so that it monotonically decreases in amplitude beginning at a time when the phase locked loop receives the preamble portion and continuing to monotonically decrease during at least a portion of the time that the phase locked loop receives the data portion. The response time may be monotonically decreased in any suitable fashion, such as linearly or exponentially. A specific embodiment of a linearly decreasing signal generator used with a charge pump is disclosed. The results of computer simulations showing a decrease in lock acquisition time and increased noise immunity with shortened preamble time are also discussed.

6 Claims, 5 Drawing Sheets

PHASE LOCKED LOOP WITH BANDWIDTH RAMP

FIELD OF THE INVENTION

This invention relates generally to the field of phase locked loops, and particularly to a phase locked loop where the bandwidth is slowly decreased to reduce lock acquisition time and noise sensitivity.

BACKGROUND OF THE INVENTION

It is often necessary in a data processing system to read an input data signal from a peripheral device which does not provide a synchronized clock signal. Such a situation may occur, for example, at the interface between a disk drive controller and a disk drive, or at the interface of an asynchronous communications controller and its associated asynchronous communication device. To enable reading of the input signal, a local oscillator must normally be synchronized to transitions found in the input signal itself.

With the typical scenario, local oscillator synchronization is achieved by using an input signal which has two portions. A preamble portion, consisting of closely spaced transitions created by an alternating pattern of logical ones and logical zeros, precedes a data portion, which contains the information to be read. The preamble portion is fed to a phase locked loop (PLL). As is well known a PLL provides a continuous output signal which is phase and frequency locked to its input signal. Phase and frequency lock will occur if the preamble portion is sufficiently long in time to guarantee that the loop reaches a stable state. A suitable clock signal synchronized to the input signal is thus provided at the output of the phase locked loop once the stable state is reached.

A critical design decision in this situation is selecting the phase locked loop bandwidth, since the maximum possible time that it can take for the loop to lock, called the settling time, is inversely proportional to the loop bandwidth. Thus, the larger the loop bandwidth, the shorter the preamble portion can be, and the more time can be spent reading data. Unfortunately, loop bandwidth is also directly proportional to noise susceptibility. Thus, the wider the bandwidth of the loop, the smaller its tolerance to noise in the data portion.

One way to avoid this problem has been to begin with a relatively high loop bandwidth while the PLL is locking to the preamble. Before the end of the preamble, a narrower bandwidth loop filter is switched in. This arrangement provides both the advantages of fast settling time during lock acquisition, and greatest noise immunity after the PLL has locked, while the data is being read. This switch to a narrower bandwidth also helps noise immunity because the signal to noise ratio usually decreases during the data portion due to intersymbol interference.

While this approach has been found adequate in most situations, it is not generally known that other problems exist. One such problem is that a noise pulse occurring just before the end of the preamble may cause a large loop error. Because the loop bandwidth is then narrowed, this large loop error can take a very long time to settle out, during which time the loop is not completely locked. This translates into increased occurrence of data recovery errors. When data is lost, of course, the peripheral must be re-accessed, thereby increasing the overall data read time.

A second problem is caused by the act of changing the loop bandwidth itself. Because this normally involves switching circuit components in and out of the loop, any resulting switching transients often are large enough to perturb the loop. The error thus caused must also be corrected at the lower bandwidth, which takes a much longer time than if the bandwidth had never been decreased.

The first problem is a result of changes in the signal fed to the input of the loop. The latter problem is caused by changes in the transfer function of the loop as its bandwidth changes. Another way to understand this is to consider that the frequency-domain response of a system depends upon the product of the frequency-domain representation of its input signal and the system transfer function. Changes in either the input signal or the system transfer function thus affect the loop's output signal.

In applications such as disk drive controllers, phase synchronization must be reacquired every time a different sector on the disk is selected for access. Since the time spent reading and locking to the preamble portion is time not spent reading data, the need for long preambles can adversely affect the data transfer rate of the disk drive. Perhaps even more importantly in disk drive applications, the need for longer preambles decreases the usable storage capacity of the drive.

SUMMARY OF THE INVENTION

In brief summary, a phase locked loop constructed in accordance with the invention has an input control for varying the loop response time. The response time is monotonically increased over a period of time at least as long as a loop time constant equal to the reciprocal of the natural frequency of the loop at its beginning, or largest bandwidth. Preferably, the increase in response time takes place over a period of time longer than several loop time constants.

The loop response time is changed by reducing the loop bandwidth. One way to adequately reduce the bandwidth is to slowly decrease the gain of the loop. Another way to adjust the bandwidth of the loop is to change the bandwidth of a loop filter.

The loop gain or loop filter bandwidth may be decreased, and hence loop response time increased, in any suitable fashion. One preferred embodiment uses an exponential decrease, since that perturbs the loop minimally. The gain or loop filter bandwidth may also be linearly reduced. Other functions of bandwidth or gain versus time may be used, as long as their Fourier transform is sufficiently bandlimited.

An exponential change is optimum in the sense that the lasrgest changes in loop bandwidth occur nearest the beginning of the preamble portion, when the loop bandwidth is greatest, and when the most time is available for perturbations to settle out. However, the gain or bandwidth may also be reduced linearly, or in other ways, as long as the period of the loop bandwidth reduction is extended beyond the end of the preamble portion in the input signal.

Whereas it was previously thought ideal to complete the gain or bandwidth reduction before the end of the preamble, it has been found that when this reduction is extended into the data portion, noise susceptibility is further reduced.

There are certain advantages realized with this arrangement. The loop is noticeably less susceptible to noise perturbations occurring near the end of the preamble, because the noise susceptibility is reduced in proportion to the time left to attain full phase lock. The loop itself also settles in a shorter time, since the act of switching to the narrower bandwidth occurs slowly, thereby markedly reducing bandwidth switching transients. Therefore, the preamble portion of the input signal may be shortened, which allows the data portion to be longer. This in turn enables more data to be stored on a given disk. The shorter lock time is important when reading data from a disk drive, since the loop needs to be repeatedly re-locked to a different preamble every time a different sector of the disk is accessed.

BRIEF DESCRIPTION OF THE DRAWINGS

This invention is pointed out with particularity in the appended claims. The above and further advantages of the invention may be better understood by referring to the following description in conjunction with the accompanying drawings, in which:

DETAILED DESCRIPTION OF ILLUSTRATIVE EMBODIMENTS

Figure 1:
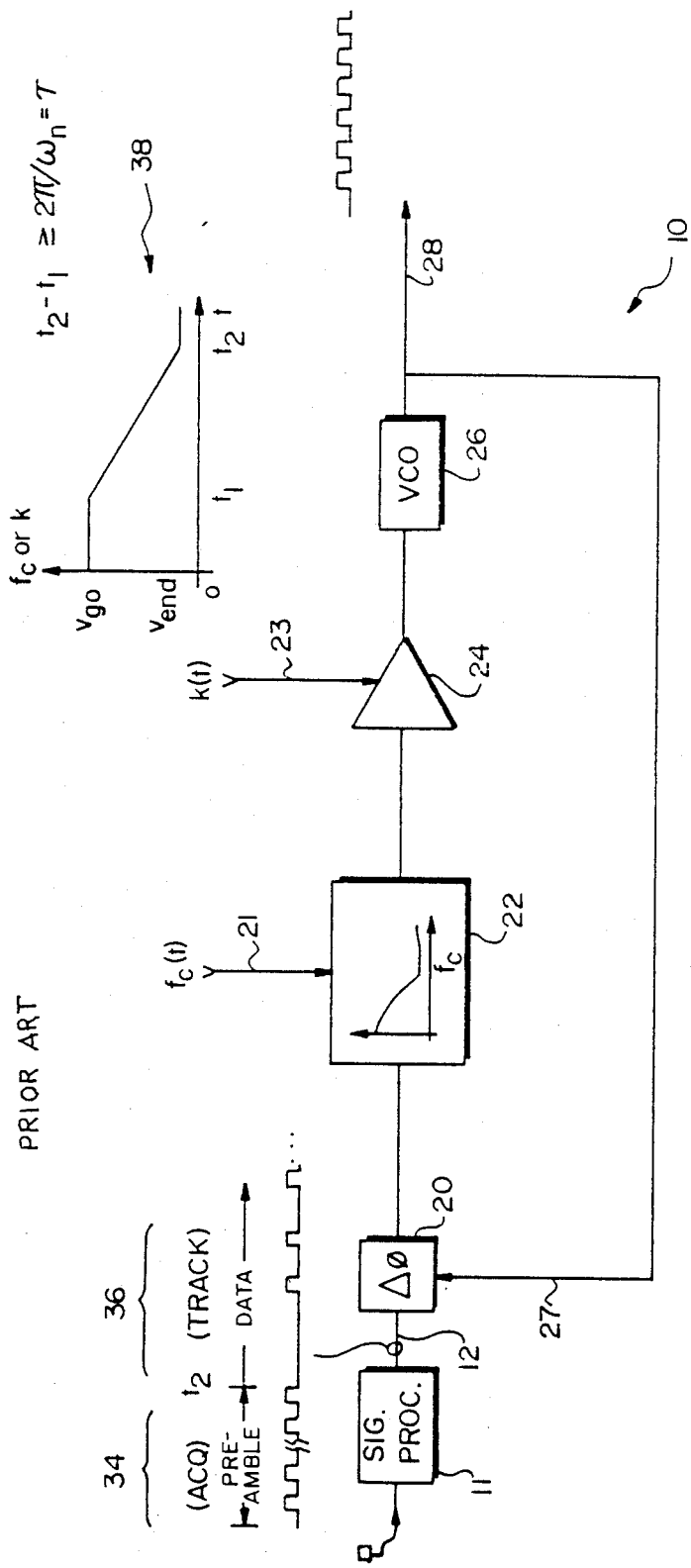
FIG. 1 depicts a block diagram of a phase locked loop constructed in accordance with the prior art.

Referring now to FIG. 1, there is shown a block diagram of a phase lock loop 10 (PLL) constructed in accordance with known techniques. The PLL 10 is connected to operate on an loop input signal 12 received from a peripheral device 14 such as a disk drive. In the illustrated prior art circuit, the loop input signal 12 is a digital output signal from a signal processor 11 which receives the output of a read/write head 16 associated with the drive 14. The PLL 10 includes a phase detector 20, a loop filter 22, a loop amplifier 24, and a voltage controlled oscillator (VCO) 26 connected in series. The phase detector 20 provides a voltage indicative of the phase difference between the loop input signal 12 and a VCO output 27 provided by the VCO 26. This difference is then filtered by loop filter 22 and amplified by loop amplifier 24 before being used to control the VCO 26. The illustrated PLL 10 is a type of PLL often implemented as a second order loop, with the highest power of complex frequency, or "s", in the denominator of its closed-loop transfer function is two.

The VCO 26 provides a loop output Signal 28 which is phase and frequency locked to the loop input signal 12. Specifically, the loop output signal 28 is locked to a preamble portion 34 of the loop input signal 12 which occurs before a time $t_2$. The function of the PLL 10 is to acquire phase and frequency lock to the preamble portion 34 of the loop input signal 12. The loop output signal 28 is then used to track information encoded as data in a data portion 36 of the loop input signal 12. This is typically accomplished by feeding the loop output signal 28 to a data register (not shown the Figures) arranged to receive the data portion 36 of the loop input signal 12. The operation of the PLL 10 on the preamble portion 34 is sometimes referred to as an acquisition sequence (ACK) and operations on the data portion 36 as a track sequence (TRACK).

It should also be noted that the response time, or "time constant" of the PLL 10 is adjustable. That is, the loop response time of PLL 10 may be changed by adjusting either the bandwidth of the loop filter 22, or by changing the gain of the loop amplifier 24. As FIG. 1 indicates, the bandwidth of the loop filter 22 is adjusted by changing the value of a bandwidth control 21 input on the loop filter 22. Since for second order loops it can be shown that the bandwidth is also directly related to the gain, the loop response time may also be adjusted by changing the value of a gain control 23 input on the loop amplifier 24.

As indicated in the plot 38 of the bandwidth control 21, $f_c(t)$, or gain control 23, $k(t)$, versus time, the loop filter's bandwidth or the loop gain is slowly decreased from an initial value $v_{go}$ set at the beginning of the preamble to a final value $v_{end}$. In the prior art, as plot 38 shows, $k(t)$ reaches $v_{end}$ before or at the beginning of the occurrence of the data portion 36 at time $t_2$. The filter bandwidth or loop gain is preferably held at the higher value $v_{go}$ until a time $t_1$ which is some point in the middle of the preamble portion 34, after the PLL 10 has begun to acquire phase lock.

In contrast, a distinguishing feature of the invention is to change the loop response time during an interval which begins during the preamble portion of the input signal and continues at least partially into the data portion of the input signal. This avoids any gain transient that might otherwise occur at the end of the preamble portion or at the beginning of the data portion.

The loop response time may be changed either by adjusting the bandwidth of the loop filter or by adjusting the loop gain. The response time change may occur exponentially, linearly, or in accordance with any other suitable function, as long as it monotonically increases with time.

The change in response time preferably occurs over a time interval at least as long as the time constant of the loop. With the present invention, since the loop parameters are dynamic, we define the loop response time as the reciprocal of the undamped natural frequency $w_n$ of the loop before time $t_1$, when the response time is shortest (i.e., when the filter bandwidth is widest or the gain is greatest).

Figure 2:
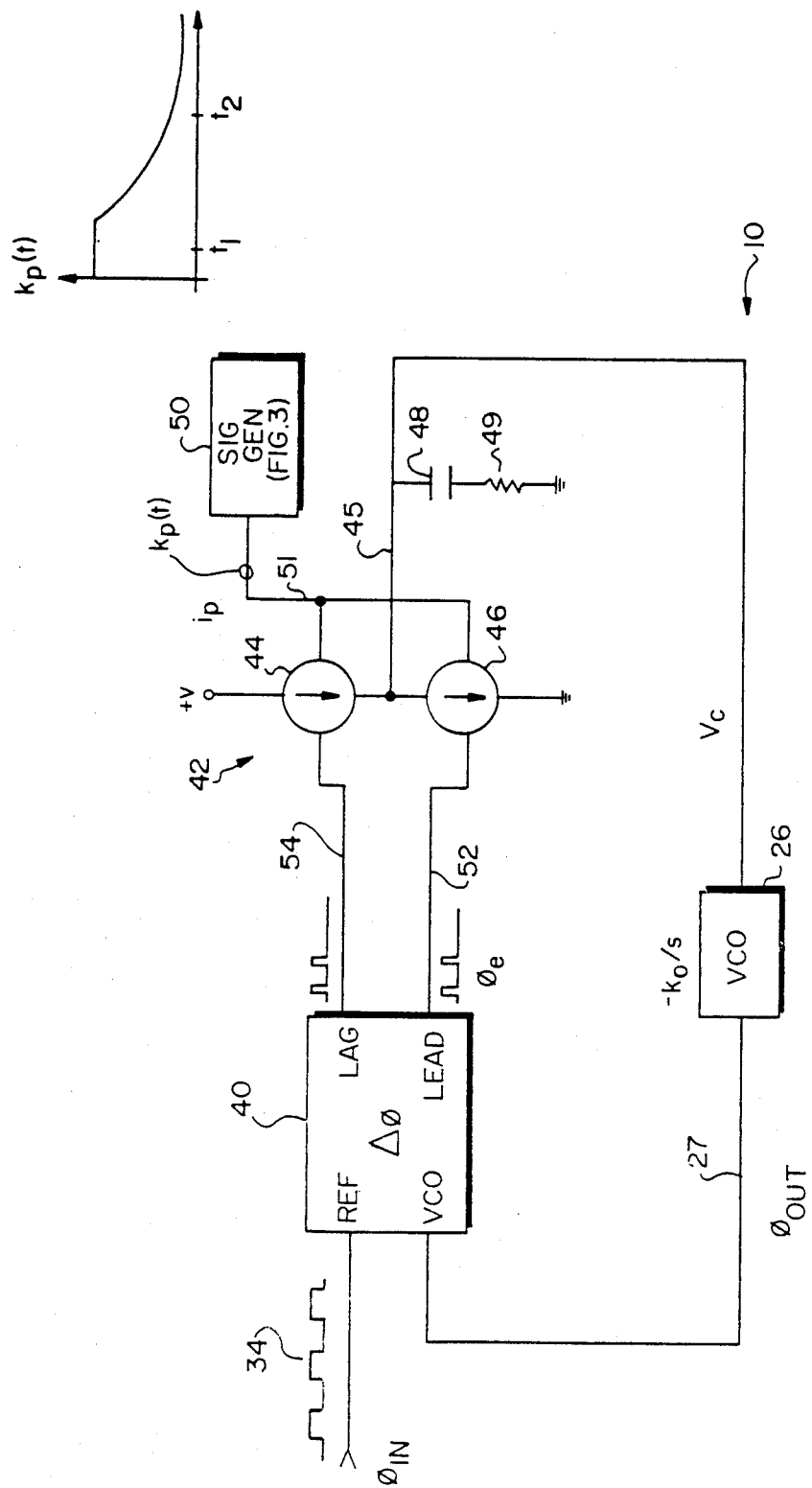
FIG. 2 is a block diagram of one embodiment of the invention which uses a charge pump having a gain control input fed by a ramp signal generator.

FIG. 2 is a high-level circuit diagram of one embodiment of the PLL 10 according to this invention. This implementation uses a lead-lag type phase comparator 40 to compare the difference between the phase of the preamble portion 34 and the VCO output 27 from the VCO 26. The means for adjusting the loop response time is provided by a charge pump 42, which corresponds to the variable gain amplifier 24 and a fixed loop filter 22 of FIG. 1. The charge pump 42 consists of a positive charge source 44, a negative charge source 46, a capacitor 48, and a discharge control resistor 49. The amount of charge provided by positive charge source 44 or negative charge source 46 to the capacitor 48 is controlled by a signal from the control signal generator 50, in addition to the normal control via its input commands 52 and 54. One embodiment of generator 50 is shown in greater detail in FIG. 3, which is discussed later.

Still referring to FIG. 2, but more particularly now, the phase comparator 40 provides either lag or lead output pulses depending upon whether the transitions of the VCO output 27 occur before or after transitions of the preamble 34, respectively. The lag pulses are provided on a lag output 54 line, and the lead pulses on a lead output 52 line. The width of the lead and lag pulses so provided is proportional to the time difference between the pulse edges.

If lead pulses exist at the lead output 52, this indicates the VCO 26 is phase-leading, and that its input voltage must be decreased. Accordingly, then, the lead output 52 is fed to control the operation of the negative charge source 46. The negative charge source 46 then sinks a current on a charge pump output line 45 to decrease the charge on the capacitor 48 through the discharge control resistor 49. The amount of current sunk by negative charge source 46 is directly proportional to both the width of the pulses received on lead output 52 as well as the value of a response control signal 51, $k_p(t)$, output from the response control signal generator 50. In accordance with this invention, the response control signal generator 50 provides a response control signal 51 which monotonically decreases from time $t_1$ to a point after time $t_2$.

Likewise, any lag pulses present at the lag output 54 control the operation of the positive charge source 44. The positive charge source 44 thus sources a current directly proportional to the width of the pulses on the lag output 54 as well as the value of the response control signal 51. The capacitor 48 is thereby allowed to charge.

An s-plane transfer function can be developed for the circuit of FIG. 2, which in turn quantifies the effect of the changes in gain of the charge pump 42 caused by varying the response control signal 51 in terms of the $w_n$ of the loop. In the following analysis, symbols are assigned to the various parameters:

$k_p$ instantaneous gain of charge pump 42
$i_p$ instantaneous current from charge pump 42
$k_o/s$ transfer function of VCO 26
$\Phi_{in}$ input signal 34
$\Phi_e$ phase error output of detector 40

| $\Phi_{out}$ | VCO output 27 |
|---|---|
| $v_c$ | voltage input to VCO 26 |
| c | capacitance of 48 |
| $\tau_1$ | resistance of control resistor 49 times (e) the capacitance of capacitor 48 |
| $\alpha$ | damping factor of the loop |

Since the transfer function for the charge pump is $i_p = \Phi_e k_p$ then from linear system theory, $$v_c = \Phi_e k_p \frac{1 + \tau_1 s}{cs},$$

and the loop function will be described by $$\frac{\Phi_{out}}{\Phi_{in}} = \frac{(k_p k_o/c)(1 + \tau_1 s)}{s^2 + (k_p k_o/c)\tau_1 s + (k_p k_o/c)},$$

which is recognizable as a standard form transfer function of a second order systems having an $$w_n = \sqrt{(k_p k_o/c)} \text{ and } \alpha = w_n \tau_1/2.$$

In the circuit of FIG. 2, the resulting change in natural frequency, is proportional to the change in the square root of the value of the response control signal 51, $k_p(t)$. Thus, the change in response time of the loop is inversely related to the change in the square root of the value of the response control signal.

Finally, a curve 56 of $k_p(t)$ versus time is also shown. As previously mentioned, the gain of the charge pump 42 (i.e., the control on the loop response time) may be changed in any suitably monotonically decreasing fashion. An exponential change, as shown in curve 56, is optimum in the sense that the largest changes in loop bandwidth occur nearest the beginning of the preamble portion 34 of the loop input signal 12 (FIG. 1), when the loop bandwidth is greatest, and when the most time is available to accomplish phase lock. This can also be seen by considering that the rate of change of the exponential gain control function in the curve 56 is lower nearest the end of the preamble, at time $t_2$, when the loop is most vulnerable to being upset by large changes in gain. Thus, while the bandwidth has become very small, any adverse affect of changes in bandwidth has been minimized, since the bandwidth is changing ever so slowly by time $t_2$. As will be seen also in connection with FIG. 4C, when the changes in gain have become sufficiently small near time $t_2$, the gain adjustment period is extended beyond the end of the preamble portion 34 into the data portion 36. This enables the use of a shorter preamble portion 34.

Figure 3:
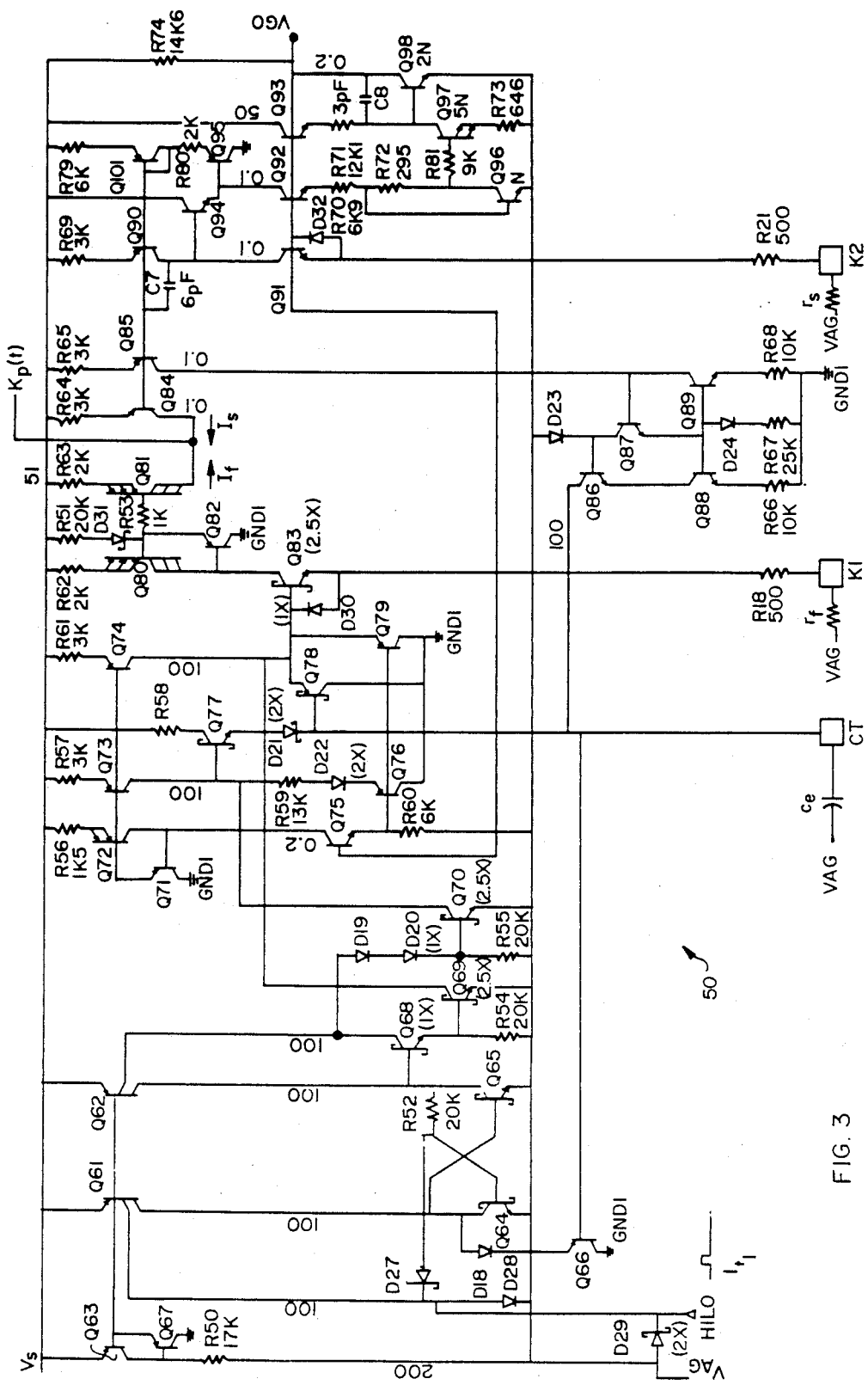
FIG. 3 is a detailed circuit diagram of one embodiment of the signal generator shown in FIG. 2.

FIG. 3 is a detailed circuit diagram of an integrated circuit implementation for the response control signal generator 50. The circuit operates with two supply voltages, $v_s$ and $v_{ag}$, to provide a ramping signal $k_p(t)$ having a maximum value $v_{go}$ (refer to plot 38 of FIG. 1) and linearly decreasing to the value $v_{end}$ between times $t_1$ and $t_2$. (The value $v_{end}$ corresponds to $v_{ag}$ minus $v_{sc}$, the Schottky voltage of the transistor junctions in the circuit of FIG. 3). The time $t_1$ is indicated to the circuit 50 by the rising edge of a pulse on an input signal, HILO. This pulse can be generated by any suitable circuit, known in the art, which produces a pulse sometime after the beginning the preamble 36. For the component values shown in FIG. 3, $v_{go} = 1.25$ v, $v_{ag} = 5$ v, and $v_s = 10$ v.

In the following discussion of the operation of the signal generator 50, the dimensionless numbers written sideways adjacent connecting lines indicate constant current in microamps.

Now more particularly, the circuit 50 is separable into two portions, a constant current generator portion, which produces a constant reference current, $i_s$, at the collector of transistor Q84, and a ramp generator portion, which produces a linearly decreasing ramp current, $i_f$, at the collectors of Q81. The output signal, $k_p(t)$, is thus the sum of the currents provided by Q81 and Q84.

The reference current $i_s$ is primarily set by Q96, Q97 and Q98, and an external resistor $r_s$ connected to the integrated circuit at an input/output pad K2. The multiple transistor Q96–Q98 serves to sufficiently drive the load presented at the output 51 by the charge pump 44 (FIG. 2). In the illustrated circuit of FIG. 3, the reference current $i_s$ equals five times the ratio $v_{go}/r_s$. The reference current $i_s$ is mirrored through Q84 to the output 51. The other transistors Q90, Q94, and Q101 insure that Q84 is biased properly in the ON state.

The ramp current $i_f$ is generated by rest of the circuit 50. Its peak value is set by $v_{go}$ and an external resistor $r_f$ coupled between the pad K1 and ground. In the embodiment depicted, the peak $i_f$ is equal to five time the ratio $v_{go}/r_f$. The starting time of the ramp is set by the state of a monostable flip flop comprised of Q64 and Q65 and the associated constant current sources Q60, Q61, Q62, Q63 and Q67. This flip flop is set, if Q65 is off upon receiving a rising edge at the HILO input coupled to the bases of Q64 and Q65.

An external timing capacitor, $c_e$, and a discharge current source Q86-Q89, determine the duration of the ramp. The ratio of the duration of intervals $t_1$ and $t_2$ is set by R59. With the component values shown, $t_1$ is set equal to one-half $t_2$.

In operation, when the flip flop transistors Q64 and Q65 are in the quiecent state awaiting a rising edge on the HILO input (the time $t=0$ in the plot 38 of FIG. 1), Q65 is off. This allows Q69 to turn on. As Q69 is coupled to control the base of Q83, Q83 is in turn allowed to turn completely off thereby raising $i_f$ to its peak value. At this time, Q70 is off so that the base voltage of Q77 is allowed to rise. A current (0.5 $v_{go}/$ R60) is mirrored through Q73 to develop a voltage equal to $v_{go}$ across R59. The voltage at the pad CT is thus raised to 2 $v_{go}$. The edge of the pulse on HILO switches Q77 off, releasing Q83 so that it can rise to a peak voltage value. The voltage follower circuit formed from Q78 and Q79 then causes the voltage at the $r_f$ pad k1 to follow the lower of the voltage on capacitor $c_e$ and $v_{go}$. Thus, between time $t=0$ and $t=t_1$ the voltage at pad $c_t$ decays to zero. Between the interval $t=t_1$ and $t=t_2$, it decays to zero together with the ramp voltage. When time $t_2$ is reached, the ramp voltage at Q83 drops lower than $v_{sc}$, causing Q66 to reset the transistors Q64, and Q65, and to return the circuit to its initial state.

Figure 4A:
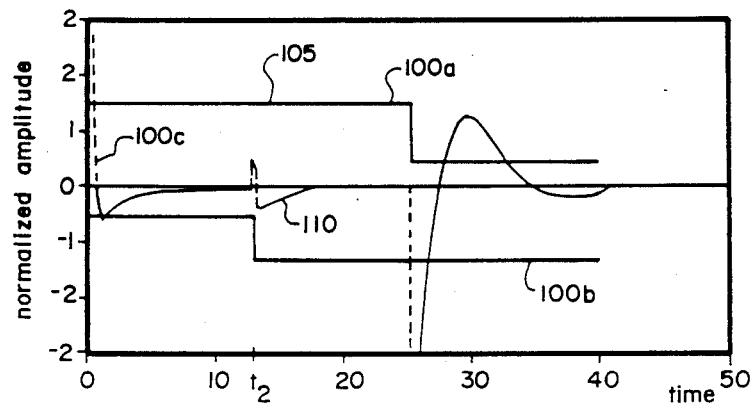
FIGS. 4A, 4B, and 4C are the results of computer simulations showing the reduced noise susceptibility and shortened loop lock time possible with the invention.
Figure 4B:
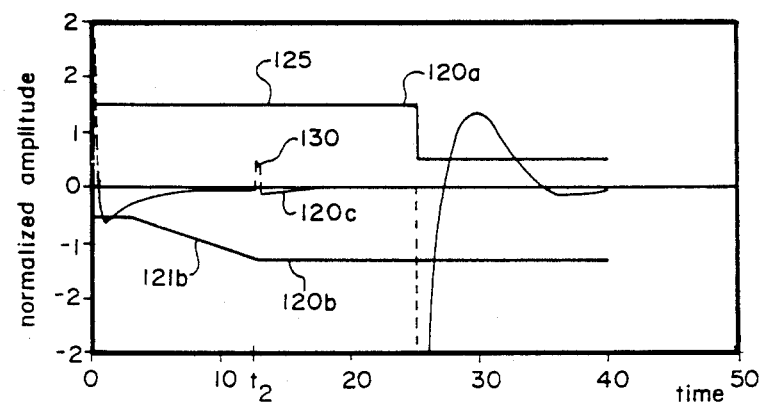
Figure 4C:
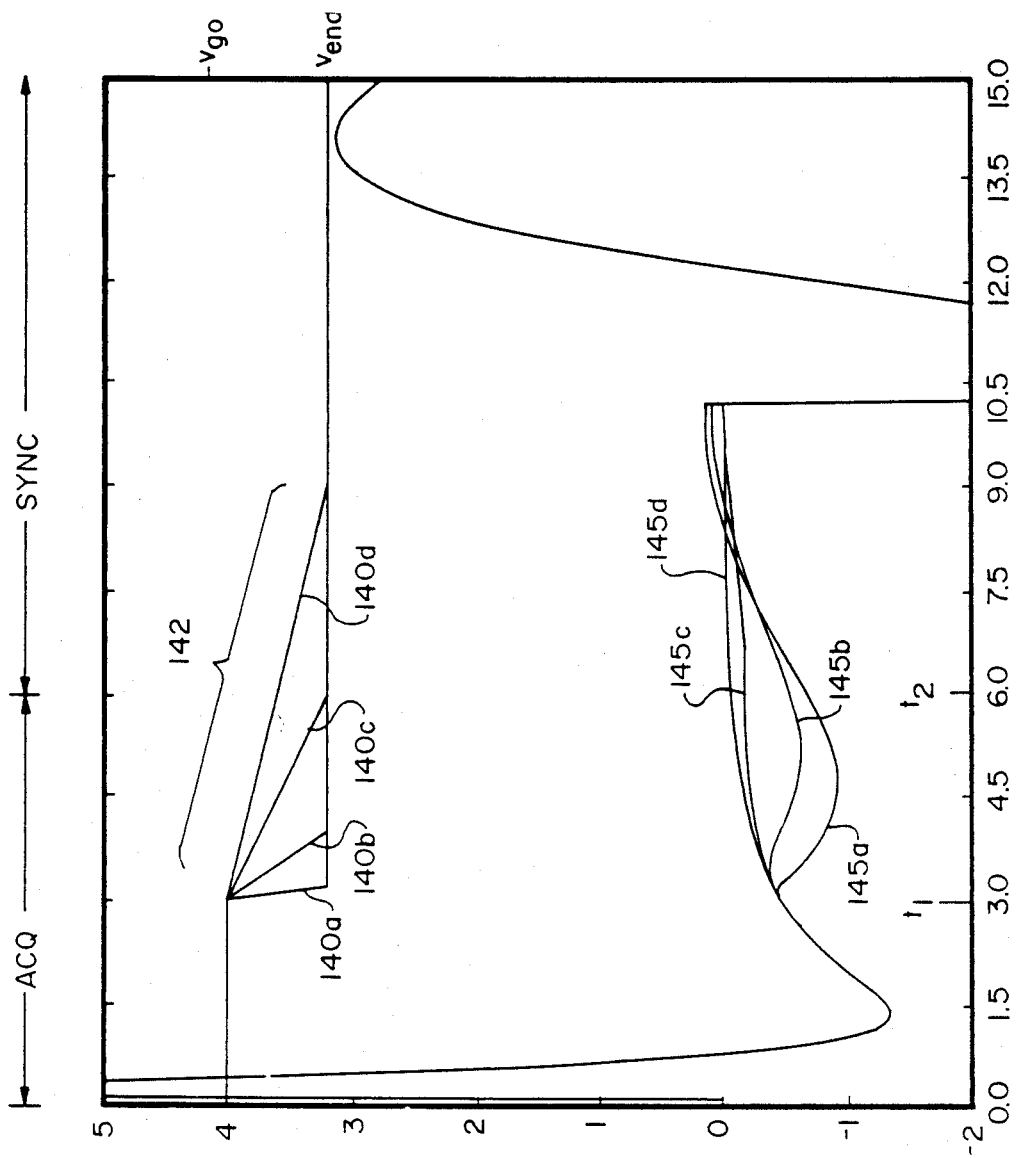

FIGS. 4A through 4C depict the results of simulations performed with computer models of a conventional phase locked loop and a phased locked loop constructed in accordance with the invention. They show how the invention is less susceptible to perturbation that previous devices. FIG. 4A plots waveforms of a prior phase locked loop circuit on a normalized time versus amplitude scale. FIG. 4A includes plots of a loop input signal 100a, a loop gain control signal 100b, and the resulting loop output signal 100c when the loop gain is abruptly changed at some point, $t_2$, after the loop has locked to an input preamble. Such gain control signals having abrupt changes have been used with certain prior circuits. Referring also briefly to FIG. 1, the signal 100a represents the phase of the input of the PLL 10 (referred to as $\Phi_{in}$ in the above calculations), the signal 100b represents the gain control output 51 of the signal generator 50, and the signal 100c the phase of the output 27 of VCO 26. A noise perturbation 105 was added to the loop input signal 100a just before time $t_2$. Note the large phase error transient 110 caused by this perturbation. The transient 110 is approximately twenty-two time units long and 0.5 amplitude units in magnitude.

FIG. 4B shows another loop input signal 120a, gain control signal 120b, and a loop output signal 120c associated with another prior art PLL 10. The loop input signal 120a was kept identical to the previous input 100a, with a corresponding perturbation 125 linearly decreasing to time $t_2$. However, signal 120b has a ramp portion 121b in which it decreases linearly until time $t_2$, rather than an abrupt change as does gain control signal 100b. Oscillations in loop error signal 120c caused as a result of the perturbation 125 are still clearly visible. Thus, by ramping the bandwidth decrease in the manner shown, the loop takes only approximately 17 time units, or almost twenty-five percent less time, to settle out. The amplitude has been reduced to 0.1 magnitude units, or about five times better. However, a gain transient still occurs at time $t_2$, just when the data portion is about to begin.

FIG. 4C illustrates a similar plot from which is discernible the advantages of this invention relating to the change in loop bandwidth itself. Plotted there are a family of gain control signals, 140a-140d, where the slope of the ramp portion 142 is varied, together with the corresponding loop phase error signals 145a-145d. As the slope of the ramp portion 142 is decreased (compare 140a with 140c), the resulting responses (compare 145a to 145c) "ring" less—that is, the resulting response is better damped. The traces 140d and 145d show the result of extending the ramp past the time $t_2$, into the data portion 36 of the loop input signal 12. The loop reaches its steady state at an even earlier time when this is done. Note particularly that in the situation shown with response signal 145d, the loop has settled after about 10 time units. In every other case, the loop requires additional time to settle. Thus, if the ramp function is so extended, the preamble portion 34 can be shortened even further, thereby shortening the time to phase lock the PLL 10.

The foregoing description has been limited to a specific embodiment of this invention. It will be apparent, however, that variations and modifications may be made to the invention, with the attainment of some or all of the advantages of the invention. For example, the present invention has been described as particularly useful for acquiring data from a disk drive. However, other data processing peripherals or systems needing in general to acquire a digital signal in minimum time may make use of the invention to their advantage. Therefore, it is the object of the appended claims to cover all such variations and modifications as come within the true spirit and scope of the invention.

What is claimed as new and desired to be secured by Letters Patent of the United States is:

1. A phase locked loop arranged to receive an input signal having a preamble portion and a data portion, the phase locked loop comprising:

A. signal generating means, for providing a response control signal which monotonically decreases in amplitude beginning at a time when the phase locked loop receives the preamble portion and continuing to monotonically decrease during at least a portion of the time that the phase locked loop receives the data portion; and B. loop control means, coupled to the phase locked loop and the signal generating means, for adjusting the response time of the phase locked loop in accordance with the amplitude of the response control signal.

2. Apparatus as in claim 1 wherein the loop control means additionally comprises:

a loop filter, coupled to receive the response control signal, and responsive to the response control signal such that the bandwidth of the loop filter decreases in accordance with the monotonic amplitude change in the response control signal.

3. Apparatus as in claim 1 where the loop means additionally comprises:

gain control means, coupled to receive the response control signal, for adjusting the gain of the phase locked loop such that the gain decreases in accordance with the monotonic amplitude change in the response control signal.

4. For use with a disk drive, a phase locked loop, arranged to receive a digital input signal from the disk drive, the input signal having a preamble portion and a data portion, for providing a digital clock signal which is phase locked to the preamble portion, the phase locked loop comprising:

A. a voltage-controlled oscillator (VCO) having a voltage input control and an output signal;
B. a phase detector, coupled to receive a reference signal and the VCO output signal, and providing pulsed lead and lag output signals;
C. a capacitor;
D. a charge pump, coupled to receive the lead and lag signals, for incrementally discharging the capacitor when a pulse is received from the lead signal, indicating that the reference signal is leading the VCO output signal, and for incrementally charging the capacitor when a pulse is received on the lag signal, indicating that the reference signal is lagging the VCO output signal, the charge pump also having an increment control input which controls the magnitude of the incremental charge or incremental discharge; and
E. means for adjusting the increment control input of the charge pump so that it monotonically decreases from an initial relatively high value at a first time when the phase locked loop begins to receive the preamble portion, to a later relatively lower value at a second time when the phase locked loop stops receiving the preamble portion, the time difference between the first and second times at least as long as a loop time constant equal to the reciprocal of a natural frequency of the phase locked loop.

5. A phase locked loop arranged to receive a digital input signal from a disk drive, the input signal having a preamble portion and a data portion, the phase locked loop providing a digital clock signal which is phase locked to the preamble portion, the phase locked loop comprising:

A. signal generating means, for providing a response control signal which exponentially decreases in amplitude beginning at a time when the phase locked loop receives the preamble portion and continuing to exponentially decrease during at least a portion of the time that the phase locked loop receives the data portion; and
B. loop control means, coupled to the phase locked loop and to the signal generating means, for adjusting the response time of the phase locked loop in accordance with the amplitude of the response control signal.

6. Apparatus as in claim 5 wherein the phase lock loop additionally comprises:

i. a voltage-controlled oscillator (VCO) having a voltage input control and an output signal;
ii. a phase detector, coupled to receive a reference signal and the VCO output signal, and providing pulsed lead and lag output signals; and
iii. a capacitor, and wherein the loop control means additionally comprises:
iv. a charge pump, coupled to receive the lead and lag signals, and the response control signal, for incrementally discharging the capacitor when a pulse is received from the lead signal, indicating that the reference signal is leading the VCO output signal, and for incrementally charging the capacitor when a pulse is received on the lag signal, indicating that the reference signal is lagging the VCO output signal, the charge pump also having an increment control input which receives the response control signal to control the magnitude of the incremental charge or incremental discharge.

* * * * *